(12) United States Patent
Wakabayashi (10) Patent No.: US 6,410,953 B2
(45) Date of Patent: Jun. 25, 2002

(54) INTEGRATED CIRCUIT DEVICE WITH MIM CAPACITANCE CIRCUIT (75) Inventor: Masaru Wakabayashi, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/805,479

(22) Filed: Mar. 13, 2001

(30) Foreign Application Priority Data

Mar. 29, 2000 (JP) ......................................... 2000-091744

(51) Int. Cl.[7] .............................................. H01L 27/108
(52) U.S. Cl. ....................... 257/300; 257/300; 257/303; 257/310
(58) Field of Search ........................... 438/238; 257/300, 257/303, 306, 347, 532, 310

(56) References Cited

U.S. PATENT DOCUMENTS 5,565,699 A * 10/1996 Kaneko et al. ............. 257/379
5,627,391 A * 5/1997 Shimada et al. ............ 257/310
5,670,808 A * 9/1997 Nishihori et al. ........... 257/310
5,818,079 A * 10/1998 Noma et al. ................ 257/310
2001/0010955 A1 * 8/2001 Chen .......................... 438/239

FOREIGN PATENT DOCUMENTS

| JP | 4-102332 | 4/1992 |
| JP | 5-90576 | 4/1993 |
| JP | 5-109726 | 4/1993 |
| JP | 10-74706 | 3/1998 |

* cited by examiner

Primary Examiner—David Nelms
Assistant Examiner—Thao P Le
(74) Attorney, Agent, or Firm—Hutchins, Wheeler & Dittmar (57) ABSTRACT A first conductive layer of metal silicide, a silicon layer, an insulating layer, and a second conductive layer of metal or metal silicide are deposited in the order named on a surface of a semiconductor substrate. Thereafter, the second conductive layer and the insulating layer are patterned to expose the silicon layer. The exposed silicon layer and the first conductive layer are patterned, thereby forming an MIM capacitance circuit.

10 Claims, 11 Drawing Sheets

INTEGRATED CIRCUIT DEVICE WITH MIM CAPACITANCE CIRCUIT

BACKGROUND OF THE INVENTION

1. Field of the Invention

The present invention relates to an integrated circuit device having an MIM (Metal Insulator Metal) capacitance circuit, and a method of manufacturing such an integrated circuit device.

2. Description of the Related Art

Various capacitance circuits have been used to temporarily holding voltages. One of those various capacitance circuits is an MIM capacitance circuit, which is a minute capacitance circuit fabricated according to the thin film technology. The MIM capacitance circuit is of a structure including a lower metal electrode and an upper metal electrode that are disposed in facing relationship to each other with a capacitance film interposed therebetween.

Figure 1:
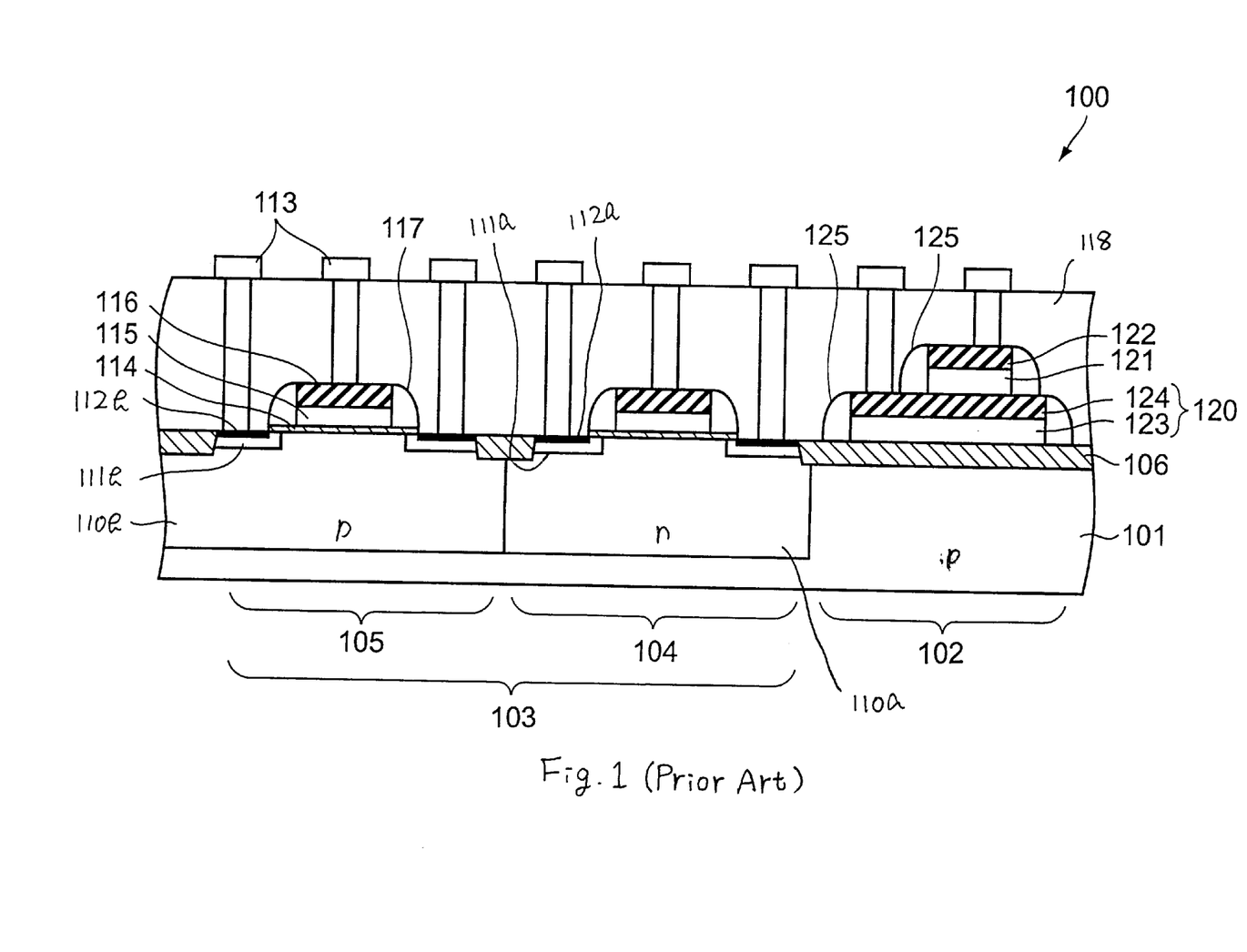
FIG. 1 is a vertical cross-sectional view of a portion of a conventional integrated circuit device.

One conventional circuit device having an MIM capacitance circuit and a transistor assembly will be described below with reference to FIG. 1 of the accompanying drawings. As shown in FIG. 1, integrated circuit device 100 is of a hybrid structure including digital and analog circuits that are mounted on single p-type silicon substrate 101.

The analog circuit has MIM capacitance circuit 102 as part thereof, and the digital circuit has CMOS transistor assembly 103 as part thereof. CMOS transistor assembly 103 comprises a pair of n-type and p-type MOS transistors 104, 105.

More specifically, element-separating field insulating film 106 is formed in the entire surface layer of silicon substrate 101 and has a pair of openings where there are disposed respective n-type MOS transistor 104 and p-type MOS transistor 105.

At the positions of MOS transistors 104, 105, there are formed respective n well 110a and p well 110b in the surface layer of silicon substrate 101. On both sides of the surface layers of n well 110a and p well 110b, there are formed n-type source and drain diffusion layers 111a and p-type source and drain diffusion layers 111b, respectively. Silicide layers 112a, 112b containing titanium are formed in the respective surfaces of source and drain diffusion layers 111a, 111b, and connected to respective aluminum electrodes 113.

Gate insulating films 114 are formed respectively in n-type MOS transistor 104 and p-type MOS transistor 105. Gate insulating films 114 extend from the surfaces of n well 110a and p well 110b to the surfaces of inner edges of source and drain diffusion layers 111a, 111b. Gate layers 115 of polysilicon and gate electrodes 116 of tungsten silicide are deposited in the order named in the central regions of the surfaces of gate insulating films 114.

Side walls 117 in the form of insulating films are formed outside of gate layers 115 and gate electrodes 116. Aluminum electrodes 113 are connected to the respective surfaces of gate electrodes 116. CMOS transistor 103 of the above structure is covered in its entirety with interlayer insulating film 118 which has contact holes where aluminum electrodes 113 are buried.

MIM capacitance circuit 102 is formed on the surface of field insulating film 106 and has lower metal electrode 120 disposed on the surface of field insulating film 106, insulating capacitance film 121 disposed on lower metal electrode 120, and upper metal electrode 122 disposed as a second conductive layer on insulating capacitance film 121. Lower metal electrode 120 comprises polysilicon film 123 and tungsten silicide film 124 as a first conductive layer. Side walls 125 are formed outside of lower metal electrode 120, insulating capacitance film 121, and upper metal electrode 122.

Figure 5:
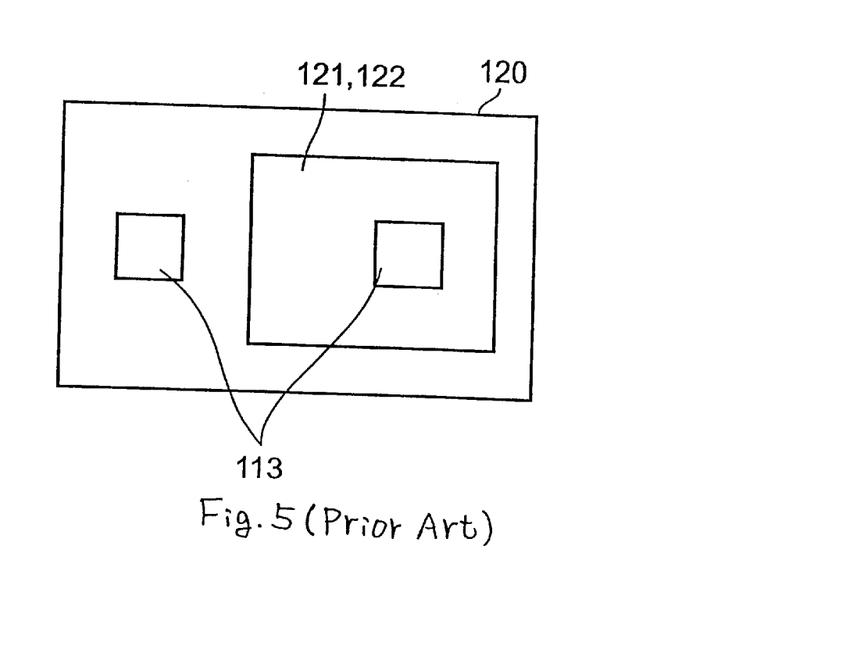
FIG. 5 is a plan view showing a patterned shape of an MIM capacitance circuit illustrated in FIG. 1.

Insulating capacitance film 121 is formed of HTO (High Temperature Oxide), and upper metal electrode 122 is formed of tungsten silicide. As shown in FIG. 5 of the accompanying drawings, insulating capacitance film 121 and upper metal electrode 122 are patterned in an area smaller than the area of lower metal electrode 120, and side walls 125 are formed outside of insulating capacitance film 121 and upper metal electrode 122.

Aluminum electrode 113 is connected to the surface of upper metal electrode 122. Aluminum electrode 113 is also connected to a region of the surface of lower metal electrode 120 which extends outwardly of insulating capacitance film 121 and upper metal electrode 122.

In FIG. 1, MOS transistors 104, 105 and MIM capacitance circuit 102 are shown as having equal dimensions. Actually, however, MIM capacitance circuit 102 has an area that is sufficiently larger than the areas of MOS transistors 104, 105.

With integrated circuit device 100 of the structure described above, CMOS transistor 103 can contribute to the digital processing of the digital circuit, and MIM capacitance circuit 102 can hold a variable voltage as an analog value of the analog circuit.

Figure 2A:
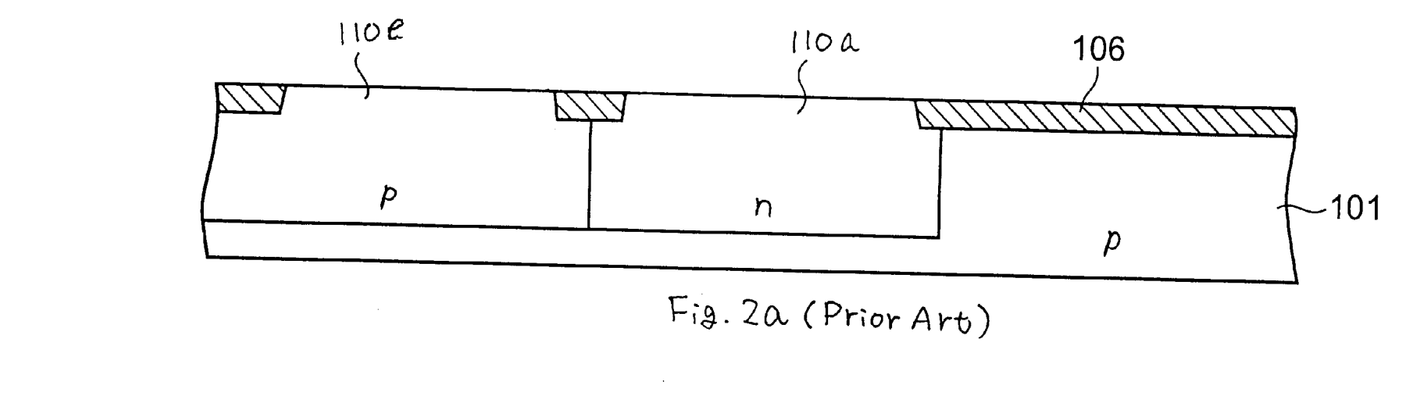
FIGS. 2a, 2b, 3a, 3b, 4a, and 4b are vertical cross-sectional views showing successive steps of a process of fabricating the integrated circuit device shown in FIG. 1.
Figure 2E:
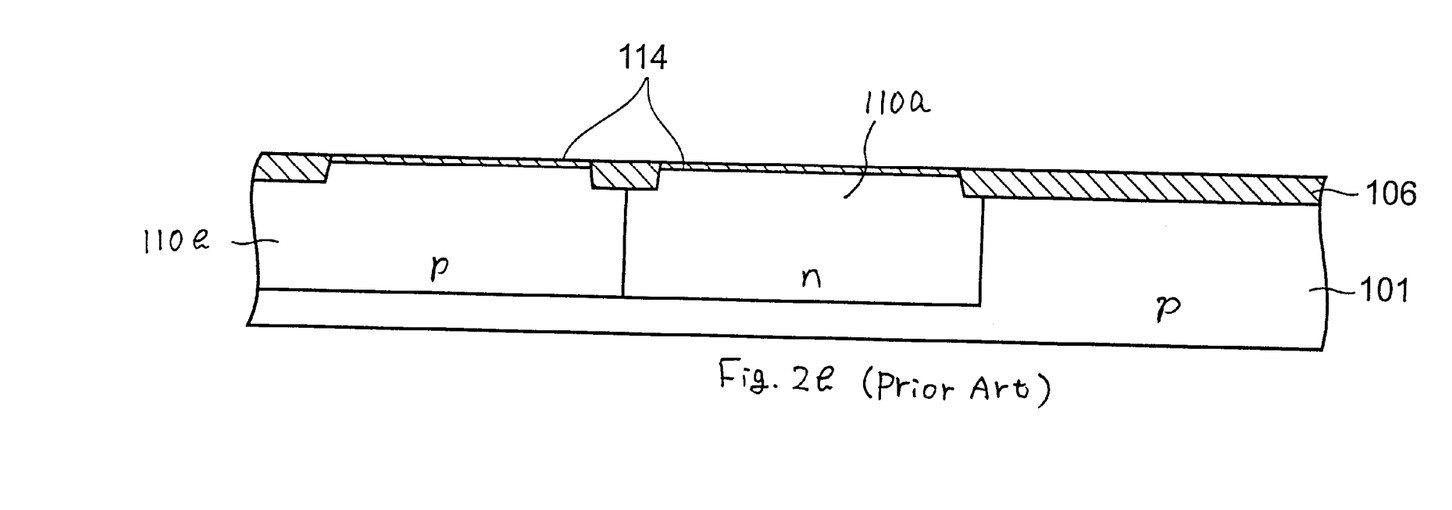

A process of fabricating integrated circuit device 100 will be described below with reference to FIGS. 2a through 4b of the accompanying drawings. First, as shown in FIG. 2a, an impurity of boron or phosphor is introduced into the surface layer of p-type silicon substrate 101 by way of ion implantation to form n well 110a and p well 110b therein, and then field insulating film 106 is formed on the surface of silicon substrate 101 in a predetermined pattern which allows portions of the surfaces of n well 110a and p well 110b to be exposed.

Figure 3A:
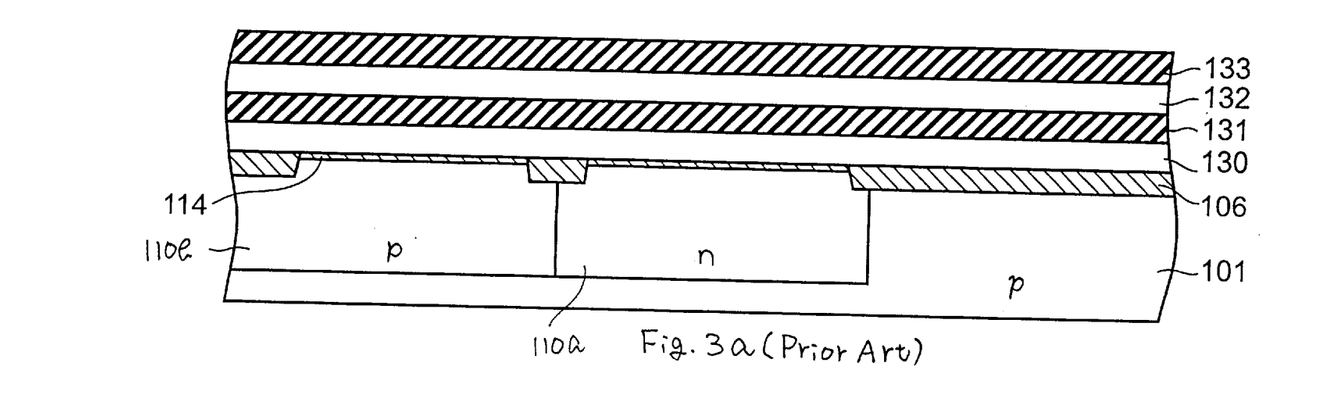
Figure 3E:
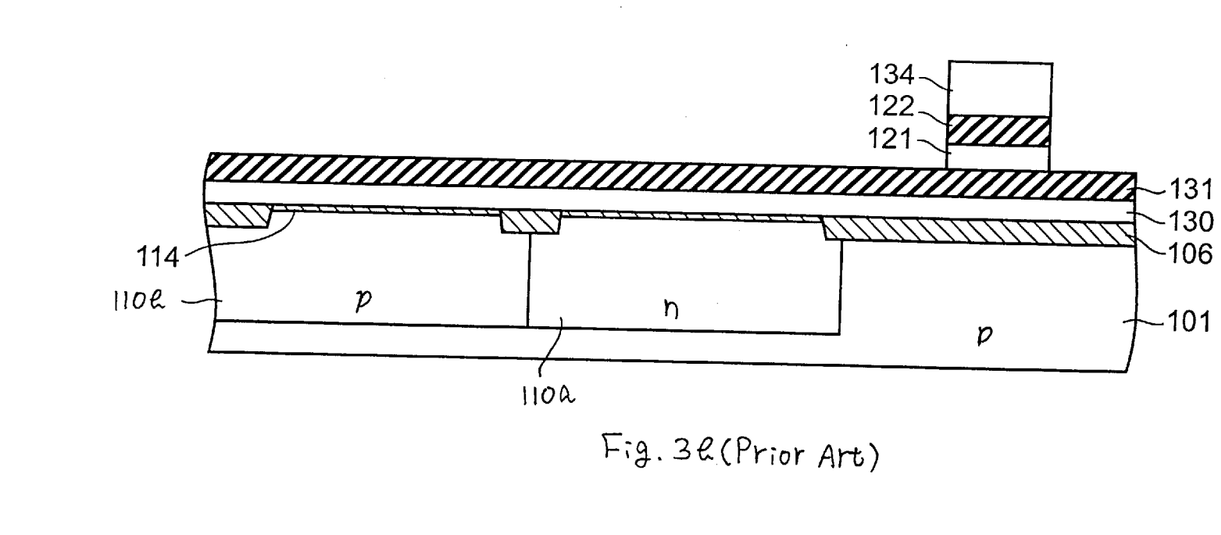

Thereafter, as shown in FIG. 2b, gate insulating film 114 is formed by way of thermal oxidization on the exposed surfaces of n well 110a and p well 110b. As shown in FIG. 3a, polysilicon layer 130, tungsten silicide layer 131 as a first conductive layer, HTO layer 132, and tungsten silicide layer 133 are grown in the order named on the entire surface of silicon substrate 101. At this time, polysilicon layer 130 and tungsten silicide layers 131, 133 are formed according to a sputtering process or a CVD process, and HTO layer 132 is formed according to a CVD process.

Then, as shown in FIG. 3b, resist mask 134 having a predetermined pattern is deposited on the surface of upper tungsten silicide layer 133, and the assembly with resist mask 134 is etched by way of dry etching to pattern tungsten silicide layer 133 and HTO layer 132, thus forming insulating capacitance film 121 and upper metal electrode 122 of MIM capacitance circuit 102.

Figure 4A:
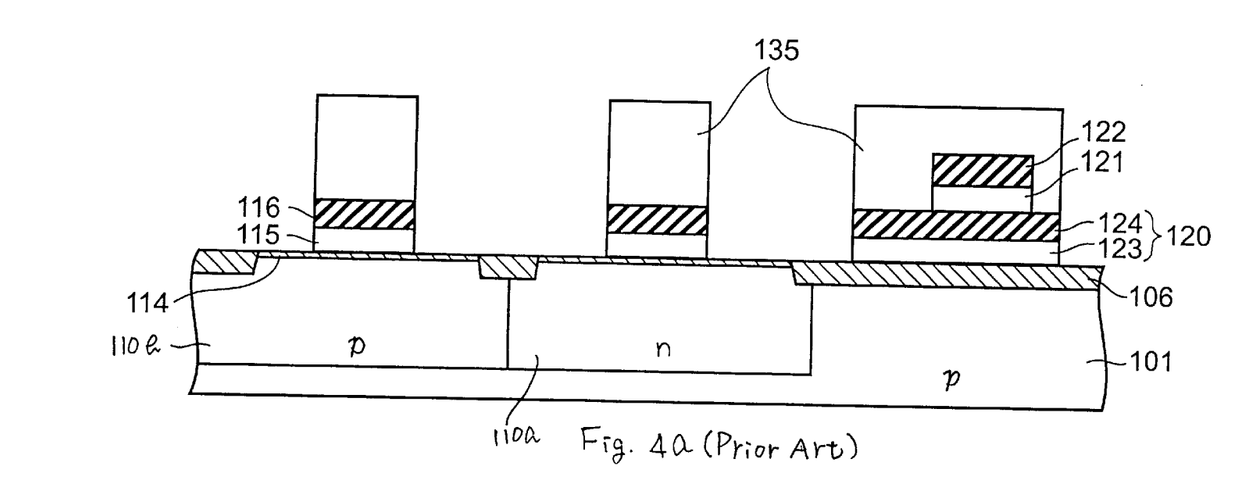
Figure 4E:
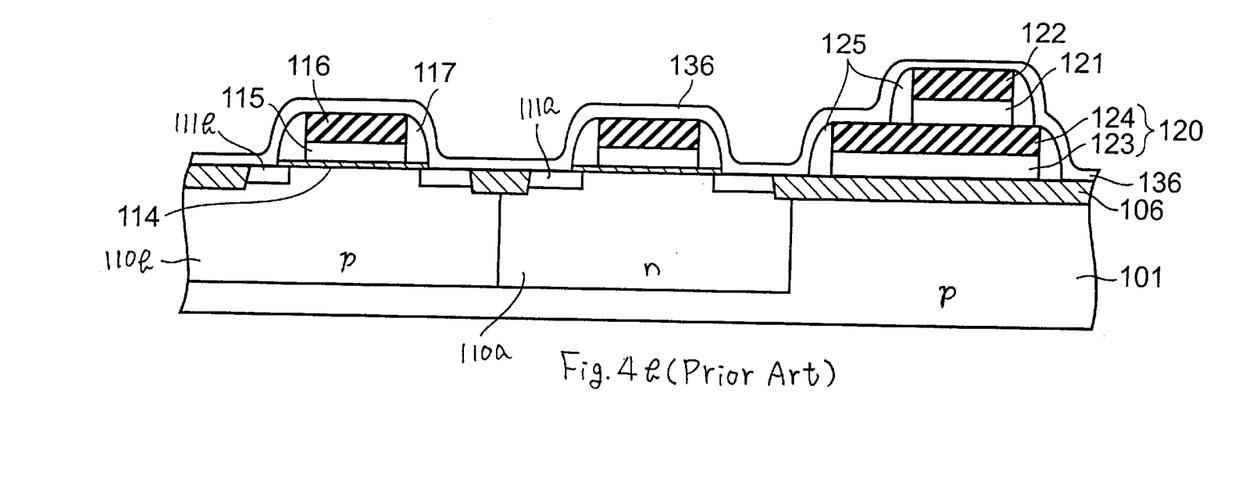

Thereafter, as shown in FIG. 4a, resist mask 135 having a predetermined pattern is deposited on the surface of lower tungsten silicide layer 131 which has been exposed by the above patterning process. The assembly with the resist mask 135 is etched by way of dry etching to pattern tungsten silicide layer 131 and polysilicon layer 130, thus forming lower metal electrode 120 of MIM capacitance circuit 102 and gate electrodes 116 and gate layers 115 of MOS transistors 104, 105.

The above dry etching process employs etching gases of $CHF_3/O_2$, $CF_4$, etc. Resist masks 134, 135 are removed by an ammonia-based solution after the dry etching process.

Then, as shown in FIG. 4b, after an HTO layer (not shown) is formed on the entire surface of silicon substrate 101 from which resist masks 134, 135 have been removed, it is etched back to form side walls 117 of MOS transistors 104, 105 and side walls 125 of MIM capacitance circuit 102. After side walls 117, 125 have been formed, thin oxide film 136 which will serve as an ion implantation mask is deposited on the entire surface of the assembly.

Then, a p-type impurity is introduced by way of ion implantation from above the surface of thin oxide film 136 into the position of n well 110a of MOS transistor 104, and an n-type impurity is introduced by way of ion implantation from above the surface of thin oxide film 136 into the position of p well 110b of MOS transistor 105. These introduced impurities are then activated by annealing to form source and drain diffusion layers 111a, 111b.

Then, thin oxide film 136 is removed by dry etching, exposing source and drain diffusion layers 111a, 111b. Then, as shown in FIG. 1, silicide layers 112a, 112b containing titanium are formed on the surfaces of exposed source and drain diffusion layers 111a, 111b. After interlayer insulating film 118 is deposited on the entire assembly, contact holes are formed therein, and then aluminum electrodes 113 are buried in the contact holes, thereby completing integrated circuit device 100.

With integrated circuit device 100 of the structure described above, MIM capacitance circuit 102 can hold a variable voltage as an analog value of the analog circuit, and CMOS transistor 103 can contribute to the digital processing of the digital circuit. The above fabrication process can fabricate integrated circuit device 100 with an increased productivity because MIM capacitance circuit 102 and CMOS transistor 103 can be formed simultaneously on one substrate.

Figure 6:
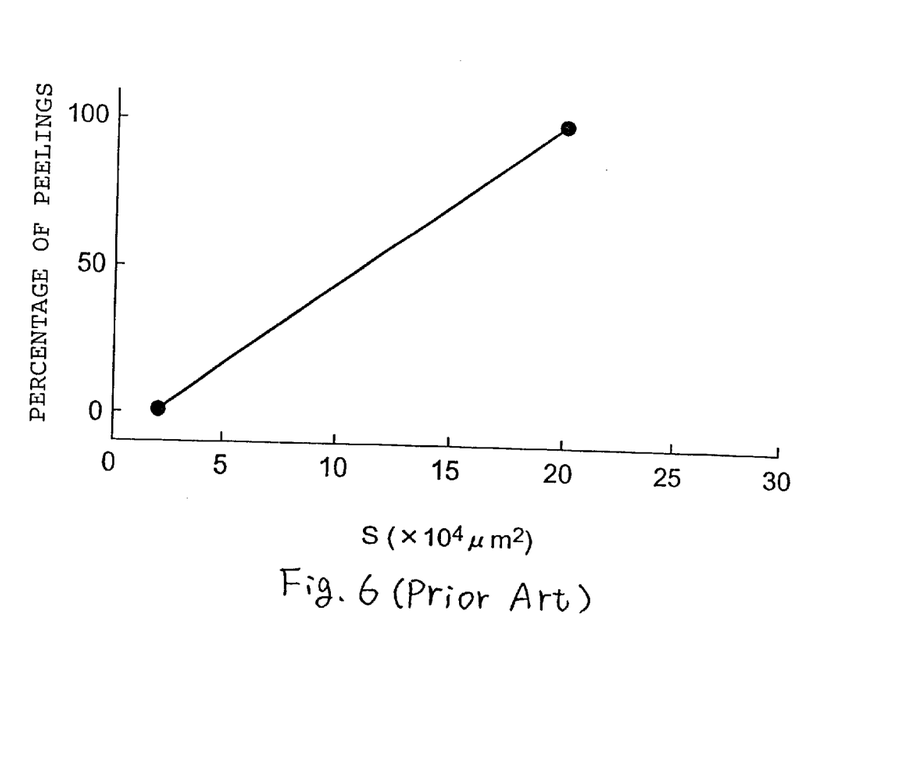
FIG. 6 is a graph showing the relationship between the area of the MIM capacitance circuit illustrated in FIG. 1 and the percentage of peelings thereof.

When the inventor has actually fabricated integrated circuit device 100, however, it has been found that many voids and peelings have occurred in the boundary between polysilicon film 123 and tungsten silicide film 124 and the boundary between tungsten silicide film 124 and insulating capacitance film 121 of MIM capacitance circuit 102. As described above, MIM capacitance circuit 102 has its area increased by CMOS transistor 103 to meet functional requirements. However, as shown in FIG. 6 of the accompanying drawings, as the area S of MIM capacitance circuit 102 increases, the above defects, or specifically peelings of tungsten silicide film 124 and insulating capacitance film 121, occur more frequently.

An analysis made by the inventor of the above defects has revealed that a lot of damage is accumulated in tungsten silicide film 124 (tungsten silicide layer 131) in the process of fabricating integrated circuit device 100 and causes defects in and around tungsten silicide film 124.

Specifically, since HTO layer 132 is formed on the surface of tungsten silicide layer 131 by a CVD process, a silicon component flows out of tungsten silicide layer 131 due to the heat produced by the CVD process, reducing the silicon concentration in tungsten silicide layer 131.

As described above, insulating capacitance film 121 and tungsten silicide film 124 are patterned by dry etching to expose tungsten silicide layer 131, and exposed tungsten silicide layer 131 and polysilicon layer 130 are patterned by dry etching. It has also been found that in these dry etching processes, components F, O of the etching gases $CHF_3/O_2$, $CF_4$ are introduced into exposed tungsten silicide layer 131, thereby damaging exposed tungsten silicide layer 131.

When the above dry etching processes are carried out, resist masks 134, 135 are necessarily required to be formed and removed. Inasmuch as an ammonia-based solution is used to remove resist masks 134, 135, a silicon component flows out of tungsten silicide layer 131, reducing the silicon concentration in tungsten silicide layer 131.

According to the above process of fabricating integrated circuit device 100, in order to form source and drain diffusion layers 111 of MOS transistor 104, the p-type and n-type impurities introduced into silicon substrate 101 by way of ion implantation are activated by being annealed at 800° C. It has also been found that when these impurities are annealed, a silicon component also flows out of tungsten silicide layer 131, reducing the silicon concentration in tungsten silicide layer 131.

According to the above process of fabricating integrated circuit device 100, since a lot of damage is accumulated in tungsten silicide film 124 of MIM capacitance circuit 102 and causes defects such as voids and peelings, it has been difficult to manufacture large-area MIM capacitance circuits 102 with a good yield.

SUMMARY OF THE INVENTION

It is therefore an object of the present invention to provide an integrated circuit device having an MIM capacitance circuit in which an insulating layer on a first conductive layer is formed by a CVD process and patterned by dry etching, the integrated circuit device being made highly reliable by preventing the occurrence of defects which would otherwise be caused in the boundary between the insulating layer and a second conductive layer, and a method of manufacturing such an integrated circuit device.

In a method of manufacturing an integrated circuit device according to the present invention, an MIM capacitance circuit having a first conductive layer, an insulating layer, and a second conductive layer is formed on a surface of a semiconductor substrate. A silicon layer is formed on a surface of the first conductive layer, and the insulating layer is formed on a surface of the silicon layer. Since the silicon layer can be formed by a sputtering process which does not require heating or plasma, the first conductive layer is not damaged when the silicon layer is formed on the surface of the first conductive layer. The silicon layer may be formed of polycrystalline silicon or amorphous silicon.

The insulating layer is preferably formed of HTO by a CVD process. Inasmuch as the insulating layer is formed on the surface of the silicon layer, the first conductive layer is not damaged when the insulating layer is formed by a CVD process. Thereafter, the insulating layer is patterned preferably by dry etching. Because the insulating layer is patterned on the surface of the silicon layer, the first conductive layer is not damaged by the. patterning of the insulating layer.

Preferably, the silicon layer and the first conductive layer are patterned in an area greater than an area in which the second conductive layer and the insulating layer are patterned. After the silicon layer and the first conductive layer are patterned, at least a portion of a region of the silicon layer where the insulating layer is not deposited is removed to expose the first conductive layer, one of a pair of electrodes is connected to the surface of the exposed conductive layer, and the other of the pair of electrodes is connected to the surface of the second conductive layer. Since the silicon layer has been removed from the surface of the first conductive layer to which one of the electrodes is connected, the resistance of the junction between the electrode and the MIM capacitance circuit is not increased.

The method may include the step of forming a transistor element on the semiconductor substrate, the step of forming a transistor element comprising the steps of forming an electrode layer on the surface of the semiconductor substrate and forming a diffusion layer on the surface of the semiconductor substrate. The step of forming an electrode layer includes the steps of forming an electrode layer of the first conductive layer and removing the silicon layer from a surface of the electrode layer when the silicon layer is removed. In this manner, the transistor element can be formed on the same semiconductor substrate as the MIM capacitance circuit in the process of fabricating the MIM capacitance circuit. At this time, the electrode layer of the transistor element is formed of the first conductive layer, and the silicon layer is formed on the surface of the electrode layer. The silicon layer on the electrode layer is removed at the same time that the silicon layer is removed in the fabrication of the MIM capacitance circuit. As a result, the resistance of the junction between the electrode layer of the transistor element and the electrode connected thereto is not increased.

If the transistor element is formed on the semiconductor substrate, then the step of forming a diffusion layer comprises the steps of, after the silicon layer is patterned, forming a thin oxide film on the entire surface of the semiconductor substrate, introducing an impurity into the semiconductor substrate from a surface of the thin oxide film by way of ion implantation, and activating the impurity. After the step of forming a diffusion layer, the thin oxide film is removed by dry etching, and a portion of the silicon layer which has been exposed by removing the thin oxide film is removed. Though the thin oxide film is required to form the diffusion layer of the transistor element, the thin oxide film finally needs to be removed. The thin oxide film is removed by dry etching. By simultaneously removing the thin oxide film and an unwanted portion of the silicon layer, no dedicated step of removing the silicon layer is necessary.

The integrated circuit device according to the present invention is manufactured by the above method. The integrated circuit device thus manufactured has an MIM capacitance circuit formed on a semiconductor substrate, the MIM capacitance circuit comprising a first conductive layer of metal silicide, a silicon layer formed on a surface of the first conductive layer, an insulating layer formed on a surface of the silicon layer, and a second conductive layer of metal or metal silicide formed on a surface of the insulating layer. Since any damage caused to the first conductive layer is small, the integrated circuit device suffers few defects such as peelings in the boundary between the first conductive layer and the insulating layer, and hence is highly reliable.

The above and other objects, features, and advantages of the present invention will become apparent from the following description with reference to the accompanying drawings which illustrate an example of the present invention.

DESCRIPTION OF THE PREFERRED EMBODIMENT

An embodiment according to the present invention will be described below with reference to FIGS. 7 through 12. Those parts shown in FIGS. 7 through 12 which are identical to those shown in FIGS. 1 through 6 are denoted by identical reference characters.

Figure 7:
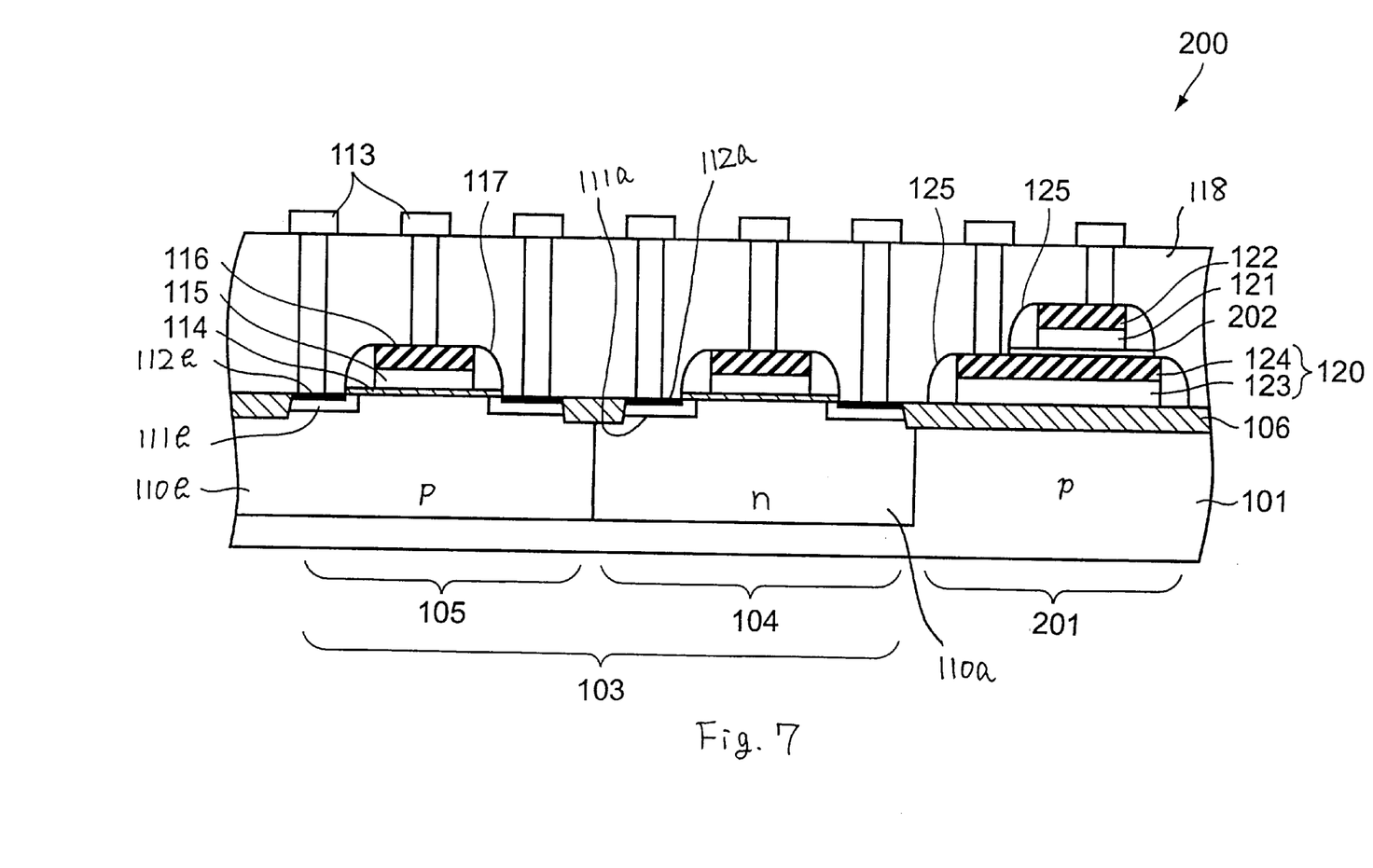
FIG. 7 is a vertical cross-sectional view of a portion of an integrated circuit device according to an embodiment of the present invention.

As shown in FIG. 7, integrated circuit device 200 according to the embodiment of the present invention has CMOS transistor 103 and MIM capacitance circuit 201 which are formed on p-type silicon substrate 101.

Integrated circuit device 200 differs from the conventional integrated circuit device with respect to the structure of MIM capacitance circuit 201. Specifically, MIM capacitance circuit 201 has silicon film 202 of polycrystalline or amorphous silicon formed on the surface of lower metal electrode 120 in the same pattern as insulating capacitance film 121 and upper metal electrode 122. Insulating capacitance film 121 is formed on the surface of silicon film 202.

Other structural and functional details of integrated circuit device 200 are the same as those of the conventional integrated circuit device, and will not be described below.

Figure 8A:
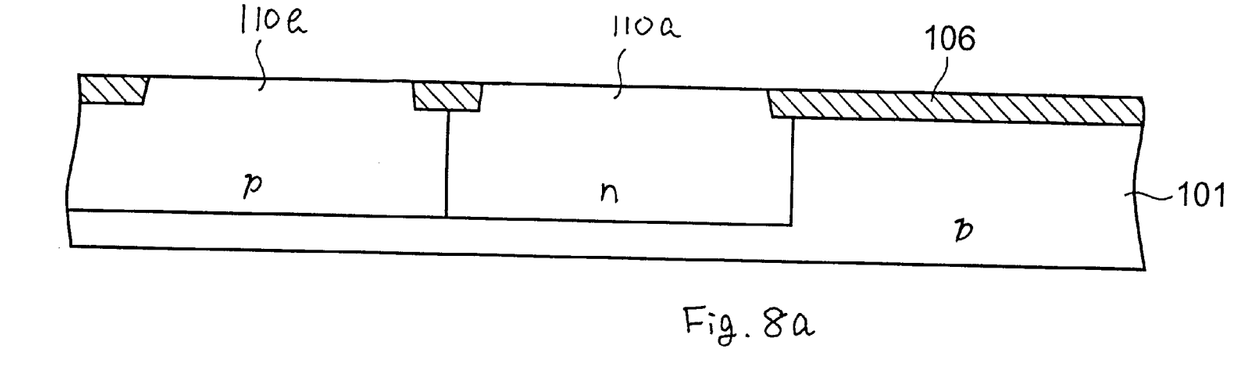
FIGS. 8a, 8b, 9a, 9b, 10a, 10b, and 11 are vertical cross-sectional views showing successive steps of a process of fabricating the integrated circuit device shown in FIG. 7.
Figure 8E:
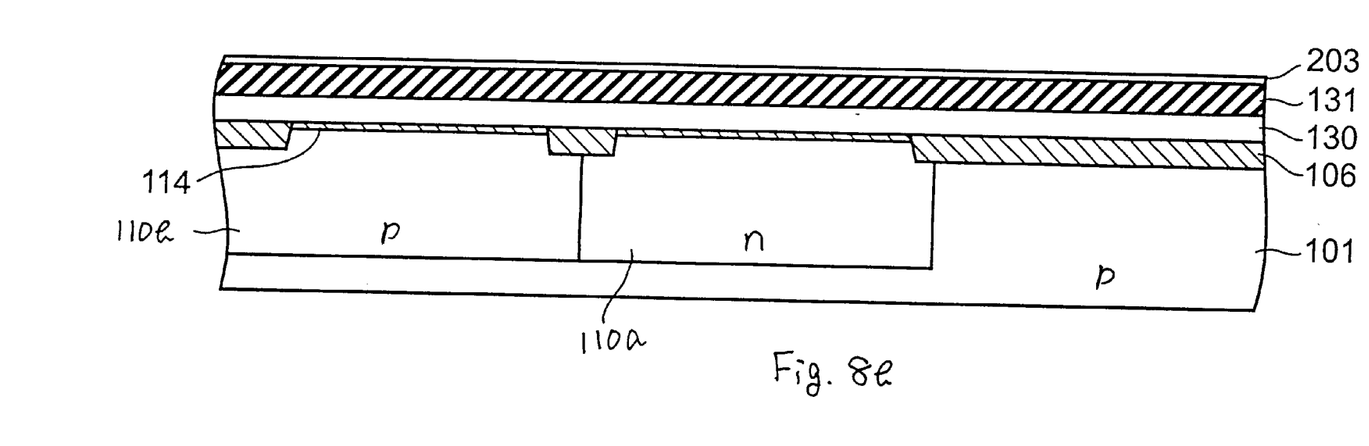

A process of fabricating integrated circuit device 200 will be described below with reference to FIGS. 7 through 11. First, as shown in FIG. 8a, n well 110a and p well 110b are formed in the surface layer of silicon substrate 101, and then field insulating film 106 is formed on the surface of silicon substrate 101 in the same manner as with the conventional process.

Thereafter, as shown in FIG. 8b, gate insulating film 114 is formed by way of thermal oxidization on the exposed surfaces of n well 110a and p well 110b. Then, polysilicon layer 130, tungsten silicide layer 131, and silicon layer 203 are formed in the order named on the entire surface of silicon substrate 101. In the present embodiment, tungsten silicide layer 131 has a silicon-to-tungsten silicide composition ratio of 2.7, and a thickness in the range from 150 to 200 nm, and silicon layer 203 has a thickness in the range from 20 to 50 nm. Polysilicon layer 130 and tungsten silicide layer 131 can be formed in the same manner as with the conventional process, and silicon layer 203 can be formed according to a sputtering process.

Figure 9A:
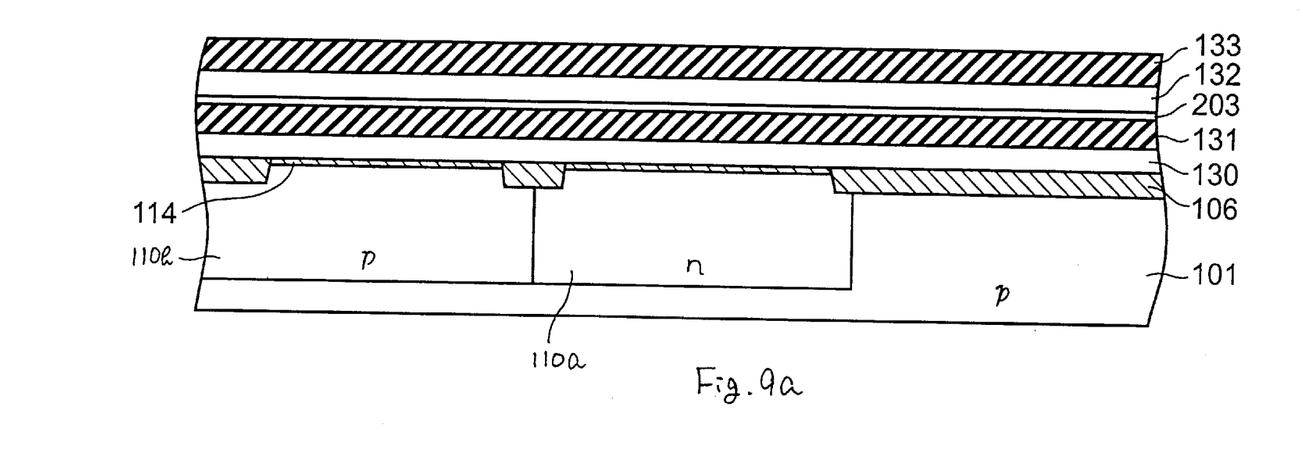
Figure 9C:
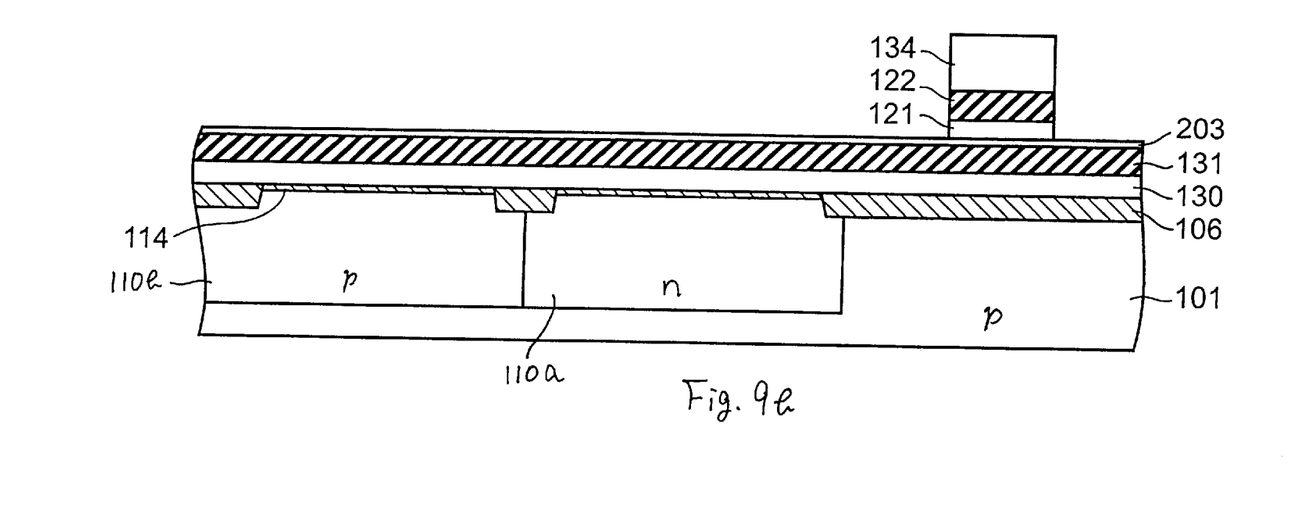

Then, as shown in FIG. 9a, HTO layer 132 is formed on the surface of silicon layer 203, and tungsten silicide layer 133 is formed on the surface of HTO layer 132. HTO layer 132 is formed in an atmosphere at a temperature ranging from 800 to 850° C. according to a CVD process, and has a thickness in the range from 30 to 50 nm. The composition ratio, thickness, and fabrication process of tungsten silicide layer 133 are the same as those of tungsten silicide layer 131 on polysilicon layer 130.

Then, as shown in FIG. 9b, resist mask 134 having a predetermined pattern is deposited on the surface of upper tungsten suicide layer 133, and the assembly with resist mask 134 is etched by way of dry etching to pattern tungsten silicide layer 133 and HTO layer 132 to the surface of silicon layer 203, thus forming insulating capacitance film 121 and upper metal electrode 122 of MIM capacitance circuit 201 on the surface of silicon layer 203.

Figure 10A:
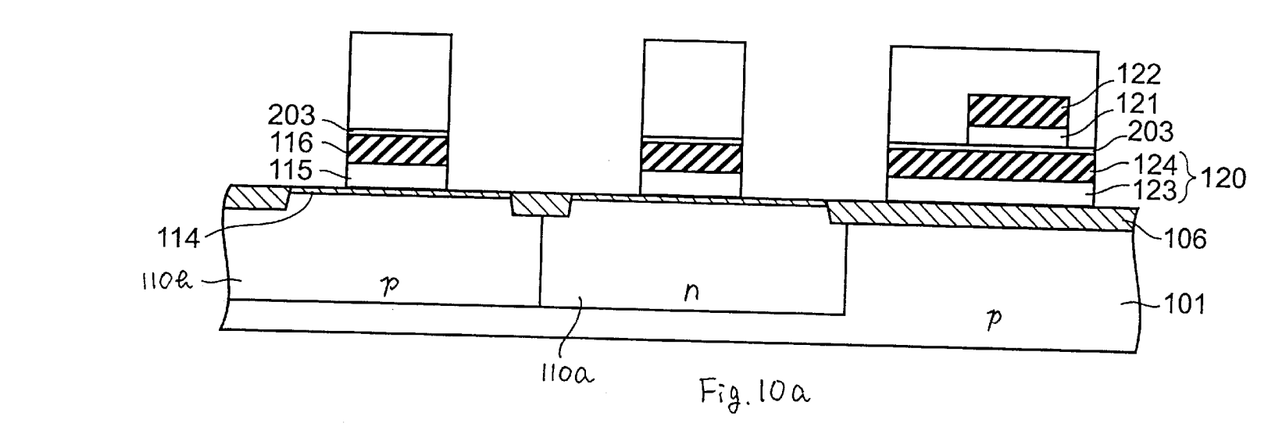
Figure 10E:
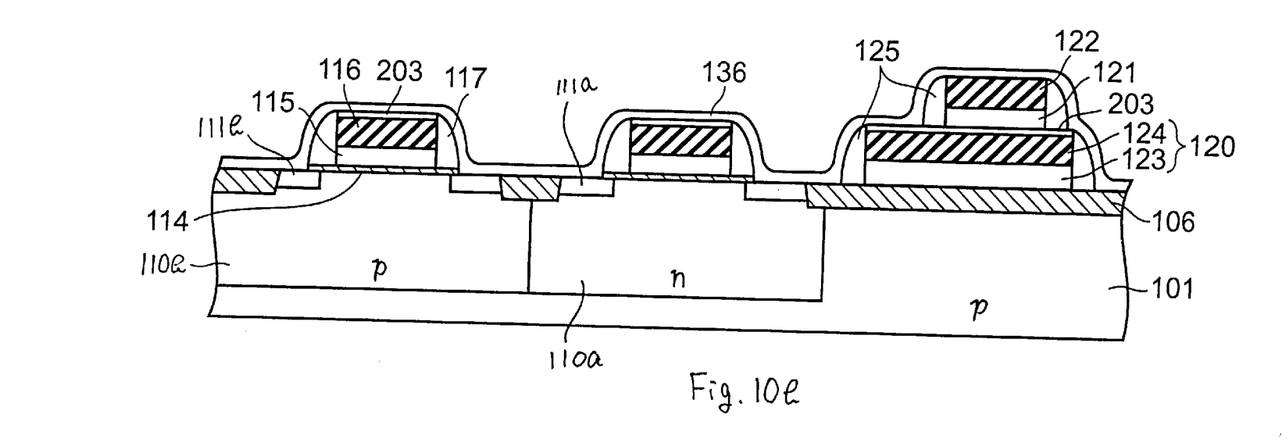

Thereafter, as shown in FIG. 10a, resist mask 135 having a predetermined pattern is deposited on the surface of silicon layer 203 which has been exposed by the above patterning process. The assembly with the resist mask 135 is etched by way of dry etching to pattern silicon layer 203, tungsten silicide layer 131, and polysilicon layer 130, thus forming lower metal electrode 120 of MIM capacitance circuit 201 and gate electrodes 116 and gate layers 115 of MOS transistors 104, 105. Specifically, silicon layer 203, tungsten silicide layer 131, and polysilicon layer 130 are patterned such that the area of the region which will serve as lower metal electrode 120 is greater than the area of insulating capacitance film 121 and upper metal electrode 122 of MIM capacitance circuit 201.

The above dry etching process employs etching gases of $CHF_3/O_2$, $CF_4$, etc. Resist masks 134, 135 on the surface of silicon layer 203 are removed by an ammonia-based solution after the dry etching process.

Then, as shown in FIG. 10b, after resist masks 134, 135 are removed, side walls 117, 125 and thin oxide film 136 are formed in the same manner as with the conventional process. Impurities are introduced from above thin oxide film 136 by way of ion implantation, and then annealed to form source and drain diffusion layers 111a, 111b. In the present embodiment, the impurities are annealed at a temperature of 800° C. or higher.

Then, thin oxide film 136 is removed in its entirety by dry etching with etching gases of $CHF_3/O_2$, $CF_4$. The mixture ratio of these etching gases is changed to increase the isotropy of the etching process. The dry etching process removes not only thin oxide film 136, but also the exposed portion of silicon layer 203. In this manner, silicon film 202 is formed only below insulating capacitance film 121 of MIM capacitance circuit 201.

Figure 11:
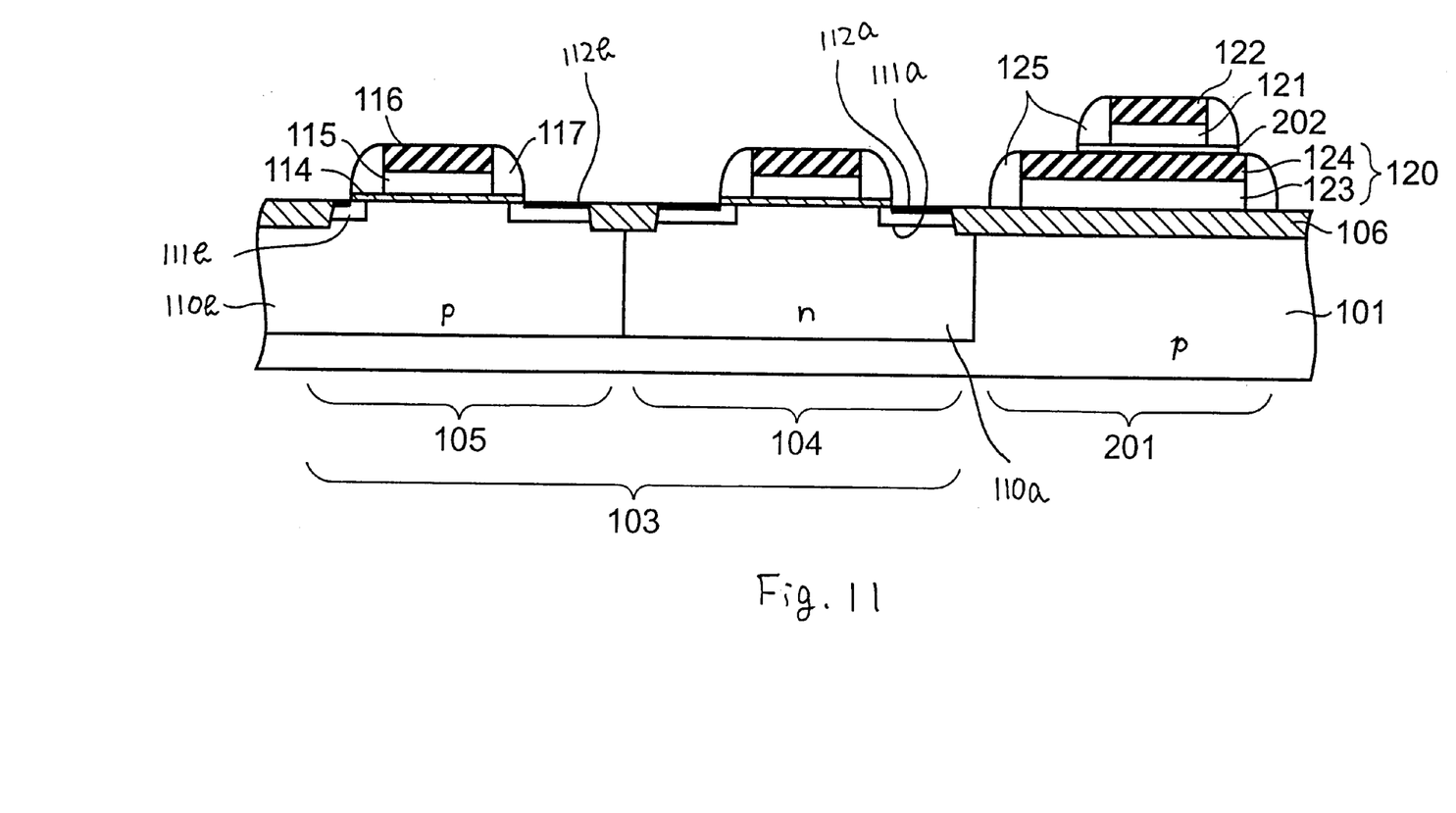

As shown in FIG. 11, silicide layers 112a, 112b containing titanium are formed on the surfaces of source and drain diffusion layers 111a, 111b which have been exposed by the removal of thin oxide film 136. Then, as shown in FIG. 7, after interlayer insulating film 118 is deposited on the entire assembly, contact holes are formed therein, and then aluminum electrodes 113 are buried in the contact holes, thereby completing integrated circuit device 200.

When aluminum electrodes 113 are buried in the contact holes in interlayer insulating film 118, since silicon layer 203 has been removed from the surfaces of lower metal electrode 120 of MIM capacitance circuit 201 and gate electrodes 116 of MOS transistors 104, 105, aluminum electrodes 113 are directly connected to the surfaces of lower metal electrode 120 and gate electrodes 116.

The above fabrication process according to the embodiment of the present invention can fabricate integrated circuit device 200 with an increased productivity because MIM capacitance circuit 201 and CMOS transistor 103 can be formed simultaneously, as with the conventional fabrication process.

In the fabrication process according to the present embodiment, HTO layer 132 is grown by the CVD process after silicon layer 203 is grown on the surface of tungsten silicide layer 131 by sputtering. Therefore, a silicon component is prevented from flowing out of tungsten silicide layer 131 due to the heat by silicon layer 203. As a result, the silicon concentration in tungsten silicide layer 131 is prevented from being reduced. Inasmuch as silicon layer 203 is grown on the surface of tungsten silicide layer 131 by sputtering, a silicon component does not flow out of tungsten silicide layer 131 which would otherwise be heated.

When insulating capacitance film 121 and upper metal electrode 122 of MIM capacitance circuit 201 are patterned by dry etching, the dry etching process is stopped at silicon layer 203, as shown in FIG. 9b. Therefore, tungsten silicide layer 131 is not exposed, and hence components F, O of the etching gases are not introduced into tungsten silicide layer 131 and do not cause damage to tungsten silicide layer 131.

After the above dry etching process, an ammonia-based solution is used to remove resist masks 134, 135. At this time, since silicon layer 203 has been deposited on the surface of tungsten silicide layer 131, a silicon component is prevented from flowing out of tungsten silicide layer 131 due to the ammonia-based solution, and hence the silicon concentration in tungsten silicide layer 131 is prevented from being reduced.

In order to form source and drain diffusion layers 111a, 111b of MOS transistor 104, silicon substrate 101 in which p-type and n-type impurities have been introduced by ion implantation is annealed. As shown in FIG. 10b, when heated by the annealing process, since silicon layer 203 has been deposited on the surface of tungsten silicide layers (gate electrode 116 and tungsten silicide film 124 produced by the patterning), a silicon component is prevented from flowing out of these tungsten silicide layers, and hence the silicon concentration in the tungsten silicide layers is prevented from being reduced.

In the above process of fabricating integrated circuit device 200, no damage is accumulated in tungsten silicide film 124 of MIM capacitance circuit 201 and hence defects such as peelings, voids, etc. are not caused. Consequently, it is easy to manufacture large-area MIM capacitance circuits 201 with a good yield.

Because silicon layer 203 has been removed from the surfaces of lower metal electrode 120 of MIM capacitance circuit 201 and gate electrodes 116 of MOS transistors 104, 105, to which aluminum electrodes 113 are connected, the interconnection resistance of MIM capacitance circuit 201 and MOS transistors 104, 105 is not increased by silicon layer 203.

Silicon layer 203 is removed at the same time that thin oxide film 136 required in the fabrication of MOS transistors 104, 105. Therefore, no dedicated step of removing silicon layer 203 needs to be added, and hence integrated circuit device 200 can be manufactured with a good productivity.

Figure 12:
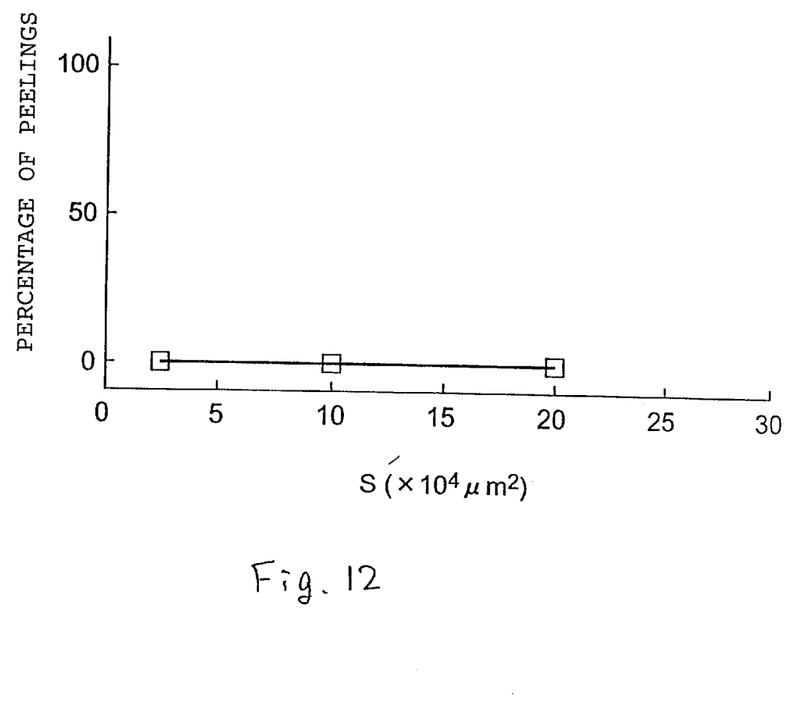
FIG. 12 is a graph showing the relationship between the area of an MIM capacitance circuit illustrated in FIG. 7 and the percentage of peelings thereof.

As described above, MIM capacitance circuit 201 has its area increased by CMOS transistor 103 to meet functional requirements. It has been confirmed that even if the area S of MIM capacitance circuit 201 manufactured by the fabrication process according to the present embodiment is increased, the percentage of peelings of tungsten silicide film 124 and insulating capacitance film 121 is not increased, as shown in FIG. 12.

Even with the fabrication process according to the present embodiment, tungsten silicide film 124 is damaged when thin oxide film 136 and the exposed portion of silicon layer 203 are etched by dry etching. Subsequent to the dry etching process, however, since integrated circuit device 200 does not need to be heated to 800° C. or higher, any defects such as voids and peelings occurring in tungsten silicide film 124 can be minimized.

In the above embodiment, upper metal electrode 122 serving as the second conductive layer is formed of tungsten silicide. However, the second conductive layer may be formed of metal or metal silicide. In the above embodiment, MIM capacitance circuit 201 formed together with MOS transistors 104, 105 is illustrated. However, the principles of the present invention are also applicable to various circuit devices in which an insulating layer is formed on the surface of a second conductive layer by a CVD process and then patterned by dry etching, and the second conductive layer exposed by the patterning process is patterned by dry etching, after which the overall assembly is heated.

Although a certain preferred embodiment of the present invention has been shown and described in detail, it should be understood that various changes and modifications may be made without departing from the spirit or scope of the appended claims.

What is claimed is:

1. An integrated circuit device having an MIM capacitance circuit, said MIM capacitance circuit comprising:
   a first conductive layer of metal silicide formed on a surface of a semiconductor substrate;
   a silicon layer formed on a surface of said first conductive layer;
   an insulating layer formed on a surface of said silicon layer; and
   a second conductive layer of at least one of a metal and metal silicide formed on a surface of said insulating layer.

2. An integrated circuit device according to claim 1, wherein said insulating layer comprises an HTO layer.

3. An integrated circuit device according to claim 1, wherein said first conductive layer has an area greater than an area of said silicon layer, further comprising a pair of electrodes, one of said electrodes being connected to a surface of said first conductive layer which is exposed from said silicon layer, the other of said electrodes being connected to a surface of said second conductive layer.

4. An integrated circuit device according to claim 1, wherein said silicon layer is formed of polycrystalline silicon or amorphous silicon.

5. An integrated circuit device according to claim 1, further comprising a transistor element disposed on said semiconductor substrate and having a diffusion layer and an electrode layer which comprises said first conductive layer, said silicon layer being removed from a surface of said electrode layer.

6. An integrated circuit device fabricated by the method of claim 1.

7. An integrated circuit device according to claim 6, wherein said insulating layer comprises an HTO layer.

8. An integrated circuit device according to claim 6, wherein said first conductive layer has an area greater than an area of said silicon layer, further comprising a pair of electrodes, one of said electrodes being connected to a region of a surface of said first conductive layer from which region said silicon layer is removed, the other of said electrodes being connected to a surface of said second conductive layer.

9. An integrated circuit device according to claim 6, wherein said silicon layer is formed of polycrystalline silicon or amorphous silicon.

10. An integrated circuit device according to claim 6, further comprising a transistor element disposed on said semiconductor substrate and having a diffusion layer and an electrode layer which comprises said first conductive layer, said silicon layer being removed from a surface of said electrode layer.

\* \* \* \* \*